United States Patent [19]

Dent

[11] Patent Number: 5,614,904
[45] Date of Patent: Mar. 25, 1997

[54] BALANCE COMPANDED DELTA CONVERSION FOR HOMODYNE RECEIVER

[75] Inventor: Paul W. Dent, Stehag, Sweden

[73] Assignee: Ericsson Inc., Research Triangle Park, N.C.

[21] Appl. No.: 401,124

[22] Filed: Mar. 9, 1995

[51] Int. Cl.$^6$ ........................................ H03M 1/06
[52] U.S. Cl. ...................... 341/143; 341/127; 455/324; 375/244
[58] Field of Search .................... 341/127, 128, 341/143; 455/324, 278.1; 375/244, 247; 327/180

[56] References Cited

U.S. PATENT DOCUMENTS

| | | | |
|---|---|---|---|
| 3,855,555 | 12/1974 | Burkhard et al. | 341/143 |
| 3,911,363 | 10/1975 | Patten | 341/143 |
| 4,527,133 | 7/1985 | Money . | |
| 4,534,038 | 8/1985 | Dodds et al. | 375/36 |
| 4,563,655 | 1/1986 | Merrick | 330/285 |
| 4,636,748 | 1/1987 | Latham, II | 331/17 |
| 4,896,156 | 1/1990 | Garverick | 341/143 |
| 4,926,178 | 5/1990 | Nallinson | 341/143 |
| 4,959,618 | 9/1990 | Shier | 328/155 |
| 5,001,725 | 3/1991 | Senderowicz et al. . | |
| 5,068,626 | 11/1991 | Takasi et al. | 331/17 |
| 5,148,170 | 9/1992 | Leopold et al. | 341/157 |
| 5,241,702 | 8/1993 | Dent . | |
| 5,392,205 | 2/1995 | Zavaleta | 363/59 |

*Primary Examiner*—Brian K. Young
*Assistant Examiner*—Peguy JeanPierre
*Attorney, Agent, or Firm*—Burns, Doane, Swecker & Mathis, L.L.P.

[57] ABSTRACT

A balanced delta-modulation analog-to-digital conversion circuit is disclosed. A first principal integrator produces a first output signal which rises when a first control signal is generated and falls when a second control signal is generated. A second principal integrator produces a second output signal which fails when the first control signal is generated and rises when the second control signal is generated. The first and second control signals are then generated based upon the differences between the first and second output signals.

17 Claims, 4 Drawing Sheets

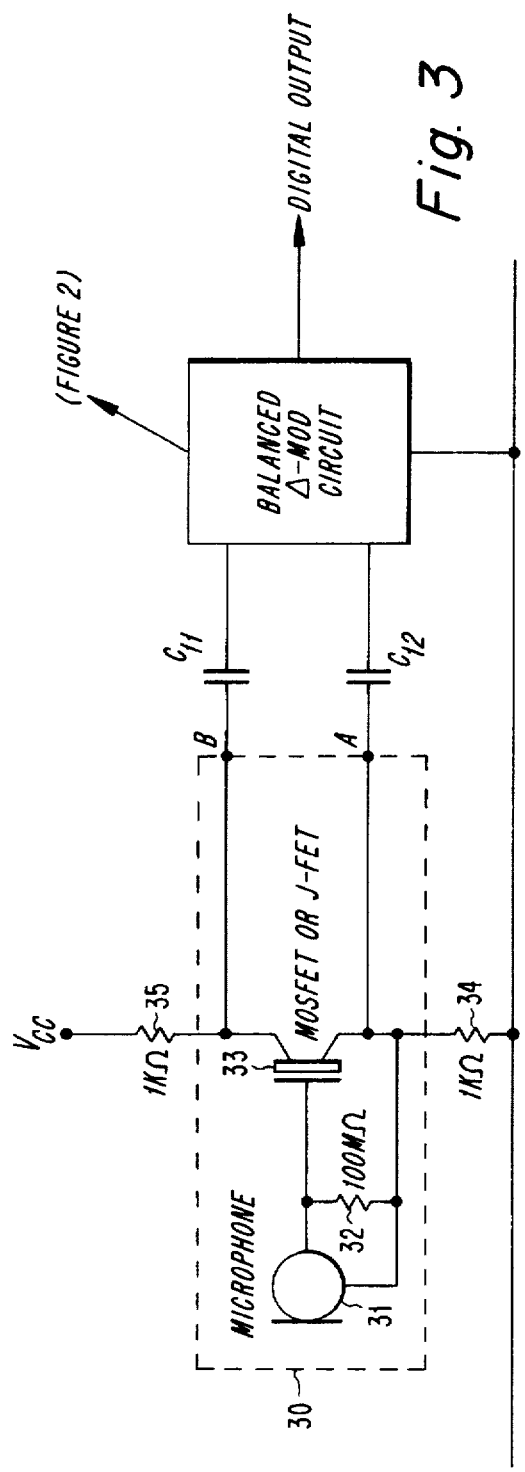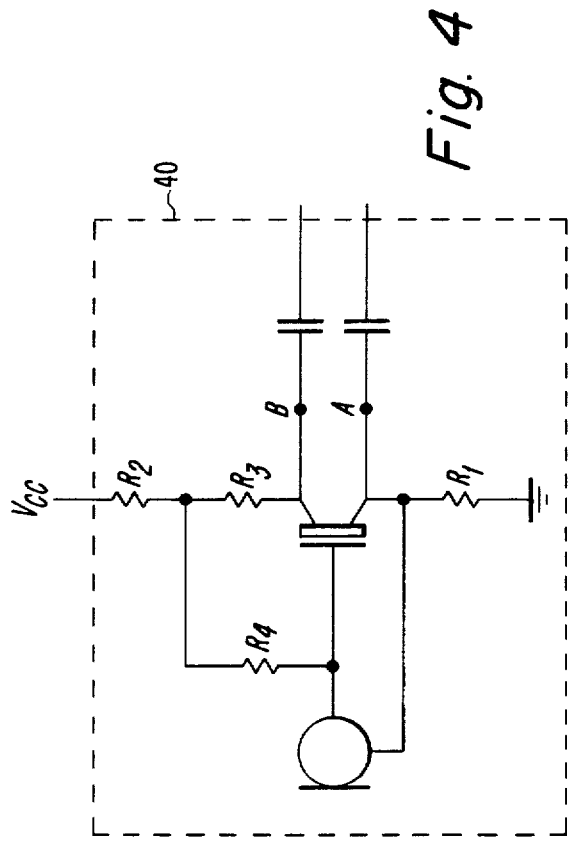
Fig. 3
Fig. 4

BALANCE COMPANDED DELTA CONVERSION FOR HOMODYNE RECEIVER

FIELD OF THE INVENTION:

The present invention relates to delta conversion for a homodyne receiver, and more particularly to a balance delta-modulation analog digital conversion circuit.

BACKGROUND OF THE INVENTION:

The present invention is directed toward a new technique for digitization of analog speech or radio signals which is not based on noise shaping but rather on companding (COMpressing the volume of a signal at one point and restoring it through exPANsion at another point) such as companded delta-modulation. The most well-known companded delta-modulation principle is called Continuously Variable-Slope Delta or CVSD modulation, and has been employed in applications where low bit rate delta-modulation was the final coding form in which the speech was desired for transmission or storage.

U.S. Pat. No. 5,241,702 discloses a homodyne receiver in which dc offset from the zero intermediate frequency down converters is removed by the differentiation inherent in the use of delta-modulation conversion. The inherent differentiation can then be removed later by reintegrating the converted results numerically in the digital domain. Furthermore, the possibility of achieving a wide dynamic range is disclosed by using companded delta-modulation conversion having a variable step size.

A variable step size may be achieved through varying the current magnitude delivered by a current source or charge pump which is used by the delta-modulator to increment or decrement the voltage on a capacitor to follow the source. U.S. patent application 08/120,426 which is incorporated herein by reference further discloses that the signal to be converted by delta-modulation can advantageously be applied in series with this principal integrator capacitor, the other end of which is connected to the charge pump and a comparator input. The advantage of this arrangement is that both the comparator input and the charge pump output operate at nearly constant voltages which simplifies their design and improves their performance.

However, practical limitations can arise when attempting to program the current magnitudes of a charge pump over a wide range. The upper current level is limited by the size of the pump transistors used, while the lower limit is limited by leakage current from the large transistors. In addition, mismatch between current levels of the pull-up and pull-down charge pump devices causes an error in the signal conversion which manifests itself as an ascending or descending slope on the reintegrated signal. One method of alleviating the slope problem is described in U.S. patent application No. 08/401,127, entitled "Slope, Drift and Offset Compensation In Zero-IF Receivers", filed Mar. 9, 1995, which estimates the slope and adds a correction term in the reintegration process to compensate it. The correction term may need to be dynamically changed in response to the programming of the charge pump current magnitudes. In another method, digital step size values can be stored and adapted separately to correspond to the charge pump's pull-up and pull-down current levels in order to ensure that the digitally reintegrated signal accurately corresponds to the analog integration of charge performed by the principal integrator capacitor. However, it may be necessary in this method to have a plurality of adapted values corresponding to different charge pump current levels which is a complication. These deficiencies in the prior art can be alleviated by using the improved balanced delta-modulation conversion according to the present invention.

SUMMARY OF THE DISCLOSURE:

It is an object of the present invention to overcome the deficiencies cited above by disclosing a balanced delta-modulator comprising two, bipolar charge pumps which are enabled in opposite directions to charge or discharge two similar capacitors in different directions. According to the present invention, the voltage on one capacitor is pulled down while the voltage of the other capacitor is pulled up or vice versa. The difference in the voltage on the capacitors is sensed with a comparator to determine which direction a charge/discharge is needed in order to keep the voltage on the two capacitors as close together as possible. Since the change in voltage difference caused by enabling the charge pumps always involves a pull-up current on one side and a pull-down current on the other side, the present invention is insensitive to mismatch between pull-up and pull-down devices.

This insensitivity is further encouraged by use of a separate common mode sensor which senses the mean voltage of the two capacitors, and controls leakage current adjustment sources on each charge pump such that the common mode voltage is held at approximately mid rail. In this way, the lowest useable current magnitude to which the charge pumps can be programmed is not limited by the leakage current but by a difference in leakage which is at least an order of magnitude less. In this way, a delta-modulation conversion having an improved dynamic range is provided.

According to one embodiment of the present invention, a balanced delta-modulation analog-to-digital conversion circuit is disclosed. A first integrator means produces a first output signal which rises when a first control signal is generated and falls when a second control signal is generated. A second principal integrator means produces a second output signal which falls when the first control signal is generated and rises when the second control signal is generated. A differencing means responds to the differences between the first and second output signals and generates the first and second control signals.

According to another embodiment of the present invention, an improved homodyne radio receiver is disclosed. Quadrature downconversion means receives a radio signal using an antenna and produces in-phase and quadrature components of the signal in phase-inverted I and Q components. First balanced delta-modulator conversion means has an input for an I component and an inverted I component for producing a first sequence of up/down commands at a regular clock rate. Second balanced delta-modulator conversion means has an input for a Q component and an inverted Q component for producing a second sequence of up/down commands at a regular clock rate. Companding means responds to the first and second up and down command sequences to produce a step size value for controlling the first and second delta-modulators. A first reintegrator means responds to a first up/down sequence to add or subtract the step size from an I accumulator. A second reintegrator means responds to the second up/down sequence to add or subtract the step size from a Q accumulator.

BRIEF DESCRIPTION OF THE DRAWINGS:

The present invention will now be described in more detail with reference to preferred embodiments of the inven-

Figure 1:
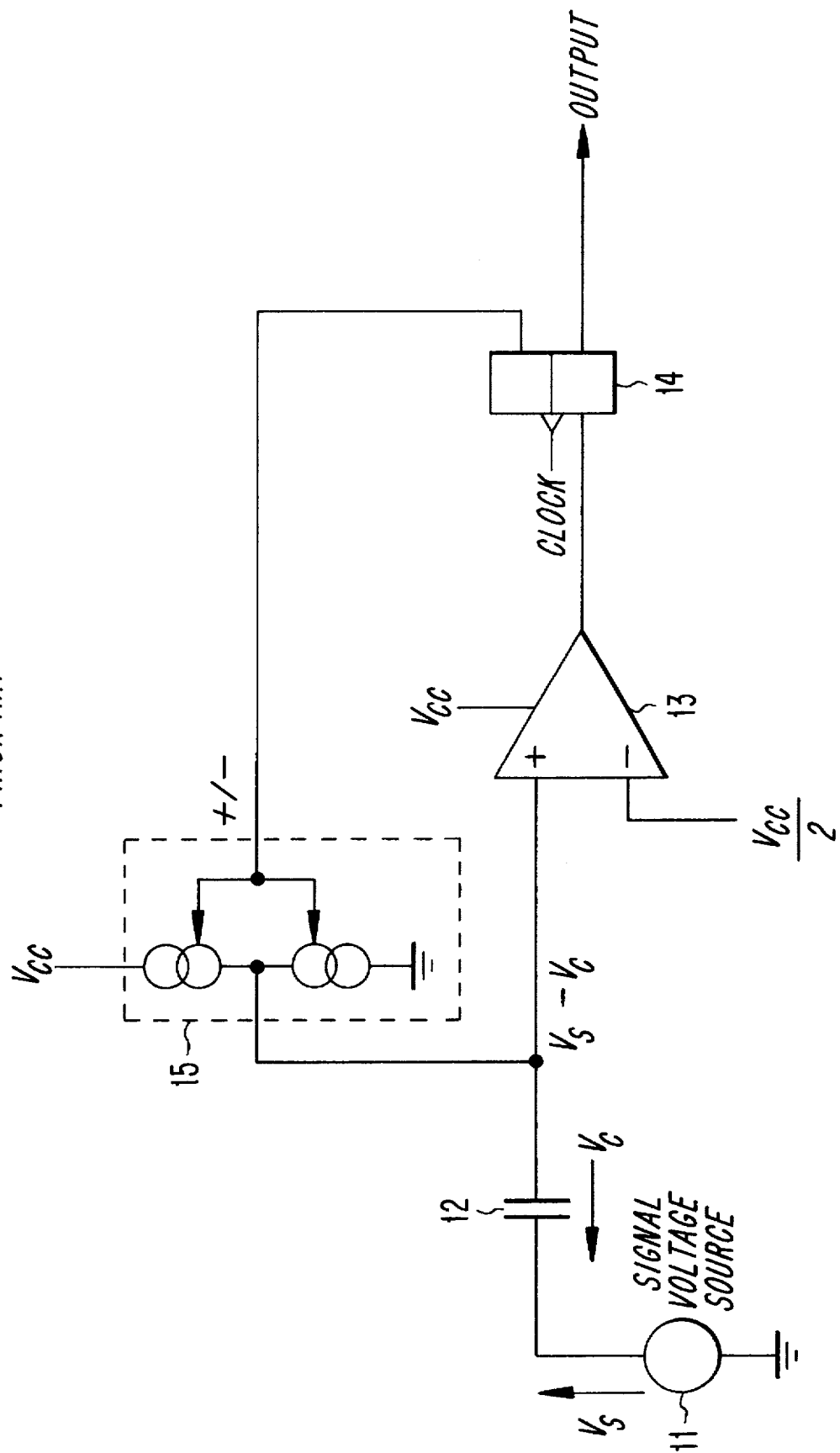
Figure 2:
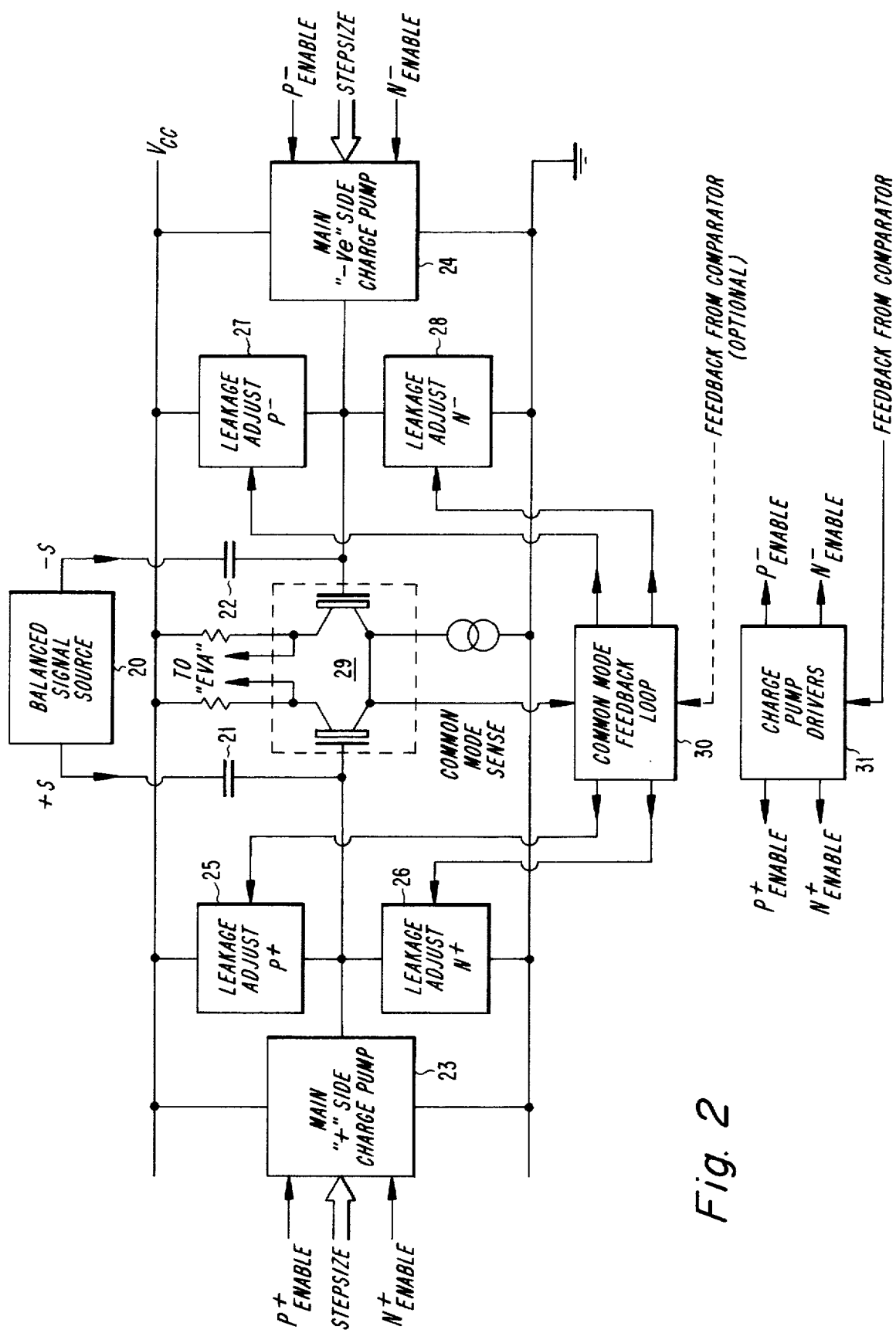
Figure 5:
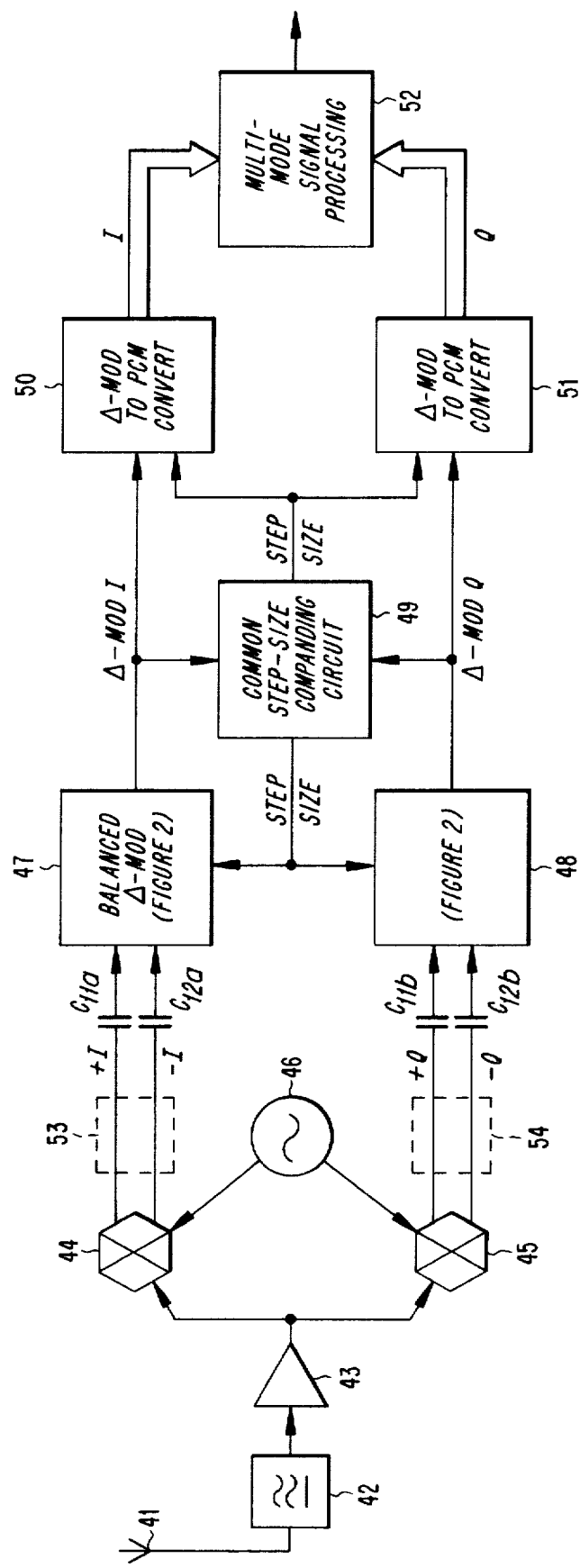

3 tion, given only be way of example, and illustrated in accompanying drawings, in which:

FIG. 1 illustrates a prior art delta-modulation input circuit;

FIG. 2 illustrates a balanced companded delta-modulator with common-mode adjustment according to one embodiment of the present invention;

FIG. 3 illustrates a connection of an active microphone to the inventive balanced convertor;

FIG. 4 illustrates an alternative circuit for providing supply noise rejection in FIG. 3; and FIG. 5 illustrates a homodyne receiver according to one embodiment of the present invention.

DETAILED DESCRIPTION OF THE PREFERRED EMBODIMENTS:

FIG. 1 illustrates a prior art delta-modulator input circuit arrangement as disclosed in U.S. patent application No. 08/120,426, which is incorporated herein by reference. A signal voltage source 11 having an instantaneous voltage output Vs is connected to one end of a principle integrator 12 which has a voltage charge Vc opposing the voltage source 11. The difference voltage Vs minus Vc appears on the other end of the capacitor 12 and is connected to one input of a comparator 13 and the output of a charge pump circuit 15. The other comparator input is connected to a fixed reference voltage which may conveniently be midway between the supply rails and a voltage of Vcc/2. If the comparator 13 senses that the difference voltage Vs minus Vc is greater than the reference Vcc/2, the comparator outputs a high level or binary "1". However if the comparator 13 senses that the difference voltage is less than the reference Vcc/2, the comparator outputs a low level or binary "0". This output value is sampled at regular intervals into a d-type flip flop 14 triggered by means of a regular clock pulse. If the sample output from the flip flop 14 is high, then the charge pump 15 decreases the voltage difference Vs minus Vc by issuing a pull-down current. However, if the sample output from the flip-flop 14 is low, then the charge pump 15 decreases the voltage difference by issuing a pull-up current. In this way, the voltage difference Vs minus Vc is maintained as close as possible to the reference voltage Vcc/2 at which the input of the comparator 13 and the output of the charge pump 15 operate most favorably.

When the input voltage Vs is not changing, it is desired for the output of the flip flop 14 to alternate between high and low or 1 and 0 in the sequence 101010101..., which is known as the idling pattern. The idling pattern causes the charge pump to alternately hold the charge Vc on the capacitor 12 higher and lower such that the voltage difference Vs minus Vc hovers around the reference voltage Vcc/2. However, this will only occur if the pull-up and pull-down currents are exactly equal, but more accurately if the charge pulled out of the capacitor during the pull-down period exactly equals the charge added in the pull-up period. However, exact equality will not in practice be attained. Therefore, an idling pattern 10101010... will be accompanied by a slow drift of the voltage difference Vs minus Vc in one of the directions such that sooner or later an extra 1 or 0 will be needed to correct the drift. Thus, idling patterns such as 101010110101011010 ... or 101010010100010101001 ... can arise. When these sequences are applied to an up/down counter or digital integrator to reconstruct the signal voltage by digital reintegration as described in U.S. Pat. No. 5,241,702, the

4 reintegrated value will not oscillate around a constant voltage by plus or minus a small step size but will take a double step each time two consecutive bits are encountered thus causing the value to drift in one direction, which is undesirable.

The present invention alleviates this problem by using the improved, balanced circuit illustrated in FIG. 2. Two circuits similar to the one disclosed in FIG. 1 are formed by principle integrator capacitors 21 and 22 and charge pumps 23 and 24, respectively. The charge pumps 23 and 24 are driven by a drive circuit 31 in opposite directions, so that when the charge pump 23 is caused to pull-up, the charge pump 24 is caused to pull-down and vice-versa. The inequality in pull-up and pull-down currents is expected to apply equally to both sides since both circuits will probably be almost identically constructed on the same integrated circuit substrate. Thus, any tendency of the voltage on the capacitor 21 to drift during a 10101010 ... idling pattern would be matched by an equal tendency for the voltage on the capacitor 22 to drift such that the difference sensed by a differential pair 29 would not be perceived to drift. The amplified and drift-corrected voltage from the differential pair 29 is applied to the inputs of a normal comparator circuit such as the one illustrated in block 3 of FIG. 1, the output of which is clocked by a flip-flop such as flip-flop 4 to determine whether the charge pumps 23 and 24 shall reverse their current flow directions or not.

Although the two capacitors 21 and 22 have equal drift direction tendencies, their voltages cannot be allowed to drift in the same direction indefinitely. Thus, as well as sensing the difference voltage using the difference amplifier 29, the common voltage is also sensed and provided to a common mode feedback circuit 30 which adjusts current sources 25 and 27 or 26 and 28 depending upon the drift direction needed in order to maintain the common mode voltage within a reasonable range. In addition, an input signal source 20 does not necessarily need to have balanced outputs. A single-ended signal source may be connected to one side of the balanced delta-modulator wherein the other side is connected to ground or a reference potential.

However, the inventive balanced convertor provides the best performance when used in connection with a balanced signal source to achieve cancellation of common mode noise that can occur within integrated circuit chips or picked up on external connections. FIG. 3 shows how existing, 2-terminal, active, microphone transducers can be used to produce a balanced signal source to the convertor. A piezo-electric element 31 is typically connected to a Junction-FET transistor amplifier 33 having a drain load resistance 35. By addition of an equal resistance 34 in the ground lead A of the device, balanced antiphase output signals are obtained at terminals A and B that may be connected via principal integrator capacitors C11, C12 to the inventive balanced Delta-modulation circuit of FIG. 2.

The alternative arrangement illustrated in FIG. 4 may be used to achieve improved cancellation of supply noise on the Vcc line, by choosing the resistors R1, R2, and R3 such that supply noise appears equal and in phase at points A and B. This common mode signal is then suppressed by the balanced convertor circuit. The actual values of R1, R2, and R3 can be determined by one of ordinary skill in the art by using analog circuit simulation programs and setting a first approximation of the value of R3 equal to 1/Gm, where Gm is the transconductance of the FET, and R2 is set equal to R1-1/Gm to provide balanced signal outputs.

It will be obvious to one of ordinary skill in the art that the present invention may be combined to produce the improved companded delta-modulator and the advantages of such a device for I and Q digitization in a homodyne receiver. The present invention may be advantageously combined with the techniques disclosed in U.S. Pat. No. 5,241,702 and with the multi-mode signal processing techniques described in U.S. patent application No. 07/967,027 which is incorporated herein by reference to provide a receiver for either analog or digitally modulated radio signals as illustrated in FIG. 5.

FIG. 5 shows an antenna 41 for receiving a signal and a filter 42 for excluding strong out of band signals and for preventing such signals from saturating a low-noise amplifier 43. The amplified signal from the low-noise amplifier 43 drives two quadrature mixers 44 and 45 connected to a quadrature local oscillator 46 which is controlled by a frequency synthesizer to be centered on the desired signal frequency. Unwanted coupling of the oscillator signal to the antenna 41 represents coherent interference with the wanted signal and is a principal reason why the outputs of the quadrature mixers 44 and 45 will exhibit DC offsets that can be orders of magnitude greater than the wanted signal. These offsets are removed by differentiation during the process of analog to digital conversion by application of the technique disclosed in U.S. Pat. No. 5,241,702, followed by re-integration in the digital domain in either blocks 50, 51 or block 52. The inventive balanced delta-modulator is an improved method of accomplishing differentiation during the A-to-D conversion process, and is performed by blocks 47 and 48 which each can be arranged in accordance with FIG. 2. U.S. Pat. No. 5,241,702 discloses a common step-size companding circuit 49 for simultaneously controlling the step-size of the I convertor 47 and the Q convertor 48. The determined step-size is then employed in respective delta-PCM convertors 50 and 51 that reconstruct binary representations of the I,Q signals using the principles disclosed in U.S. patent application No. 08/120,426 which is incorporated herein by reference. The digitized binary I,Q signals may be processed to extract either an analog frequency modulation according to the AMPS format or a digital modulation according to U.S. digital cellular standard IS54 according to the technique disclosed in U.S. patent application No. 07/967,027. Alternatively, the multi-mode signal processing can extract signals according to the GSM digital cellular standard. This would only require that balanced low-pass filters 53 and 54 be provided with appropriate bandwidth and that sampling rates are appropriately chosen. A suitable sampling rate for I and Q at the output of convertors 50 and 51 is for example 80 KHz for AMPS, 194.4 KHz for IS54, and 270.833 KHz for GSM.

The present invention includes the further option of independently controlling the otherwise identical common mode adjustment current sources 25 and 27 or 26 and 28 in order to compensate for differences in the pull-up/pull-down current mis-match for the charge pumps 13 and 14 respectively and for differences in their leakage currents, which limits the lowest usable current magnitude. This can be performed, for example, during periods when the driver circuit 31 enables neither charge pump wherein leakage current is known to prevail. The illustrated optional feedback line from the comparator may then be used by the common mode adjustment circuit 30 to adjust current sources 26 and 28 or 25 and 27 unequally so that both common mode and differential mode drift due to leakage current mismatch are compensated. Even without this refinement however, the present invention offers at least an order of magnitude reduction of the aforementioned circuit drift and dynamic range limitations.

While a particular embodiment of the present invention has been described and illustrated, it should be understood that the present invention is not limited thereto since modifications may be made by persons skilled in the art. The present application contemplates any and all modifications that fall within the spirit and scope of the underlying invention disclosed and claimed herein.

I claim:

1. A balanced delta-modulation analog-to-digital conversion circuit comprising:

a first principal integrator means for producing a first output signal which rises when a first control signal is generated and falls when a second control signal is generated;

a second principal integrator means for producing a second output signal which falls when said first control signal is generated and rises when said second control signal is generated; and differencing means for responding to the difference between said first and second output signals and generating said first or second control signals.

2. A balanced delta-modulation analog-to-digital conversion circuit according to claim 1, further comprising:

common mode control means for maintaining a mean value of said first and second output signals within a desired range.

3. A balanced delta-modulation analog-to-digital conversion circuit according to claim 2, wherein said common mode control means comprises auxiliary current sources connected respectively to said first and second principal integrators and controlled in current magnitude and direction so as to stabilize common mode drift.

4. A balanced delta-modulation analog-to-digital conversion circuit according to claim 3, wherein said auxiliary current sources are also controlled to prevent drift of the difference between said first and second output voltages due to leakage current inequalities.

5. A balanced delta-modulation analog-to-digital conversion circuit according to claim 4, wherein said difference drift control is adjusted when neither said first or second control signal is applied to said integrators.

6. A balanced delta-modulation analog-to-digital conversion circuit according to claim 5, wherein said difference drift control operates independently on said first or second control signal.

7. A balanced delta-modulation analog-to-digital conversion circuit according to claim 1, wherein said first and second principal integrators each comprise a capacitor connected to a current source controlled by said control signals.

8. A balanced delta-modulation analog-to-digital conversion circuit according to claim 7, wherein another terminal of at least one of said capacitors that is not connected to said current source is connected to an input for the signal to be analog-to-digital converted.

9. A balanced delta-modulation analog-to-digital conversion circuit according to claim 7, wherein the terminals of said capacitors not connected to said current sources are connected to a balanced signal source having an inverted and a non-inverted output.

10. A balanced delta-modulation analog-to-digital conversion circuit according to claim 1, wherein one or both of said first and second principal integrator output signals also depends upon an input signal to be analog-to-digital converted.

11. A balanced delta-modulation analog-to-digital conversion circuit, comprising:

a first principal integrator means for producing a first output signal which rises when a first control signal is generated and falls when a second control signal is generated;

a second principal integrator means for producing a second output signal which falls when said first control signal is generated and rises when said second control signal is generated; and common mode control means for maintaining the mean value of said first and second output signals in a desired range.

12. A balanced delta-modulator circuit according to claim 11, further comprising:

differencing means for responding to the difference between said first and second output signals to produce either said first or second control signals.

13. An improved homodyne radio receiver means, comprising:

quadrature down conversion means for receiving a radio signal using an antenna and producing in-phase I and quadrature Q components of said radio signal and phase inverted I, Q components;

first balanced delta-modulator conversion means having an input for an I component and an inverted I component for producing a first sequence of up/down commands at a regular clock rate;

second balanced delta-modulator conversion means having an input for a Q component and an inverted Q component producing a second sequence for up/down commands at a regular clock rate;

companding means for responding to said first and second up/down command sequences to produce a stepsize value for controlling said first and second delta-modulators;

first reintegrator means for responding to said first up/down sequence to add or subtract said stepsize from a I/Q accumulator; and second reintegrator means for responding to said second up/down sequence to add or subtract said stepsize from a Q accumulator.

14. An improved homodyne receiver according to claim 13, wherein said balanced delta-modulators include common mode control means.

15. An improved homodyne radio receiver, comprising:

quadrature down conversion means for receiving a radio signal using an antenna and producing in-phase and quadrature components of said radio signal;

first balanced delta-modulator conversion means having an input for said I components and producing a first sequence of up/down commands at a regular clock rate; and second balanced delta-modulator conversion means having an input for said Q components and producing a second sequence of up/down commands at a regular clock rate.

16. An improved homodyne receiver according to claim 15, wherein said balanced delta-modulators employ a variable stepsize.

17. An improved homodyne receiver according to claim 15, wherein said balanced delta-modulators include common mode control means.

* * * * *

UNITED STATES PATENT AND TRADEMARK OFFICE
CERTIFICATE OF CORRECTION

PATENT NO.    : 5,614,904
DATED         : March 25, 1997
INVENTOR(S)   : Paul W. Dent It is certified that error appears in the above-indentified patent and that said Letters Patent is hereby corrected as shown below:

Title page, Item [54],
IN THE TITLE: Delete "BALANCE" and insert therefor --BALANCED--.

IN THE ABSTRACT: Line 6, delete "fails" and insert therefor --falls--.

COLUMN 1, line 1, delete "BALANCE" and insert therefor --BALANCED--;
         line 6, delete "balance" and insert therefor --balanced--.

COLUMN 8, line 5, delete "a I/Q" and insert therefor --an I--.

Signed and Sealed this

Seventh Day of October, 1997

Attest:

BRUCE LEHMAN

Attesting Officer

Commissioner of Patents and Trademarks